(12) United States Patent
Shim

(10) Patent No.: US 8,809,941 B2
(45) Date of Patent: Aug. 19, 2014

(54) SEMICONDUCTOR DEVICE AND METHOD FOR FABRICATING THE SAME

(75) Inventor: Dong Hwa Shim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 956 days.

(21) Appl. No.: 11/976,578

(22) Filed: Oct. 25, 2007

(65) Prior Publication Data
US 2008/0173939 A1  Jul. 24, 2008

(30) Foreign Application Priority Data
Jan. 18, 2007  (KR) .................. 10-2007-0005699

(51) Int. Cl.
*H01L 29/66* (2006.01)
(52) U.S. Cl.
USPC ............. 257/330; 257/E21.384; 257/E21.419
(58) Field of Classification Search
USPC ............ 257/330, E21.384, E21.419, E29.321
See application file for complete search history.

(56) References Cited

U.S. PATENT DOCUMENTS

| 6,649,479 B2 * | 11/2003 | Park et al. ....................... 438/279 |
| 7,902,552 B2 * | 3/2011 | Sun ................................. 257/68 |
| 2005/0250284 A1 * | 11/2005 | Park ............................. 438/270 |
| 2006/0118889 A1 * | 6/2006 | Suh ............................... 257/404 |
| 2008/0048252 A1 * | 2/2008 | Cho .............................. 257/330 |

FOREIGN PATENT DOCUMENTS

KR   10-2006-0001158 A   6/2006

OTHER PUBLICATIONS

Ruży*ł* o, Jerzy. Semiconductor Glossary: an Introduction to Semiconductor Terminology. State College, PA: Prosto Mutimedia Pub., 2004. Print.*

* cited by examiner

*Primary Examiner* — Mark Tornow
(74) *Attorney, Agent, or Firm* — IP & T Group LLP

(57) ABSTRACT

A semiconductor device includes a semiconductor substrate having an active region defined by a device isolation structure. A recessed channel is formed on the semiconductor substrate under the active region. A recessed junction region is formed between the recessed channel and the device isolation structure adjacent to the recessed channel.

6 Claims, 5 Drawing Sheets

SEMICONDUCTOR DEVICE AND METHOD FOR FABRICATING THE SAME

This application is based upon and claims the benefit of priority to Korean Patent Application No. 10-2007-0005699, filed on Jan. 18, 2007, the entire contents of which are incorporated herein by reference.

TECHNICAL FIELD

The invention generally relates to a semiconductor device. More particularly, the invention relates to a semiconductor comprising a recessed contact region and a method for fabricating the same.

BACKGROUND

Due to high integration of memory devices such as Dynamic Random Access Memory (DRAM), a technology of reducing a size of a semiconductor device has been required. In order to improve the speed and integration of the semiconductor device, the design rule of the device is reduced to decrease a channel length of the semiconductor device such as a metal oxide semiconductor field effect transistor (MOSFET).

As the semiconductor device becomes smaller and highly-integrated, the design rule of the semiconductor device has been reduced. As a result, the channel length of the MOSFET may become short. The reduction of the channel length closes a gap between a source region and a drain region, not to control of a short channel effect (SCE). A voltage of the drain region affects voltages of the source region and the channel region, which may result in degradation of active switch elements. The narrow gap between the source region and the drain region causes a punch-through phenomenon between the source region and the drain region. In order to prevent the punch-through phenomenon, a gate electrode for recessing and filling the inside of the semiconductor device is formed to increase an effective channel length, which is called a recess field effect transistor (FET) structure.

As the design rule of the device is reduced because the semiconductor device becomes smaller and highly-integrated, a size of a landing plug for electrically connecting a storage node to a bit line is decreased. The decrease of the size of the landing plug reduces an area contacted with a semiconductor substrate which is a junction region, thereby increasing a contact resistance. For example, a contact resistance is in inverse proportion to the contact area, and in proportion to the contact length. As a result, the decrease of the contact area increases the contact resistance. The decrease of the contact area increases an interface resistance between the landing plug and the bottom semiconductor substrate to cause increase of leakage current in the junction region, thereby degrading an electric characteristic of the device.

SUMMARY

Embodiments consistent with the invention are directed to a semiconductor device comprising a recessed contact region to reduce leakage current of a junction region between a storage node and a semiconductor substrate, thereby improving an electric characteristic of the device.

According to an embodiment of the present invention, a semiconductor device includes a semiconductor substrate including a device isolation structure to define an active region, a recessed channel formed on the semiconductor substrate in the active region, and a recessed junction region formed between the recessed channel and the device isolation structure adjacent to the recessed channel.

According to an embodiment of the present invention, a method for fabricating a semiconductor device comprises: forming a device isolation structure on a semiconductor substrate to define an active region; selectively etching the active region to form a first recess; selectively etching the active region to form a second recess; forming a lower gate conductive layer over the first recess, the second recess, the device isolation structure and the semiconductor substrate to fill the first and second recesses; shaping the lower gate conductive layer to be planar until the semiconductor substrate is exposed; forming an upper gate conductive layer and a gate hard mask layer over the lower gate conductive layer and the semiconductor substrate; and patterning the gate hard mask layer and the upper gate conductive layer using a gate mask to form a recess gate.

DETAILED DESCRIPTION

The present invention relates to a semiconductor device. In one embodiment of the present invention, the semiconductor device includes a recess transistor having a recessed junction region.

Figure 1:
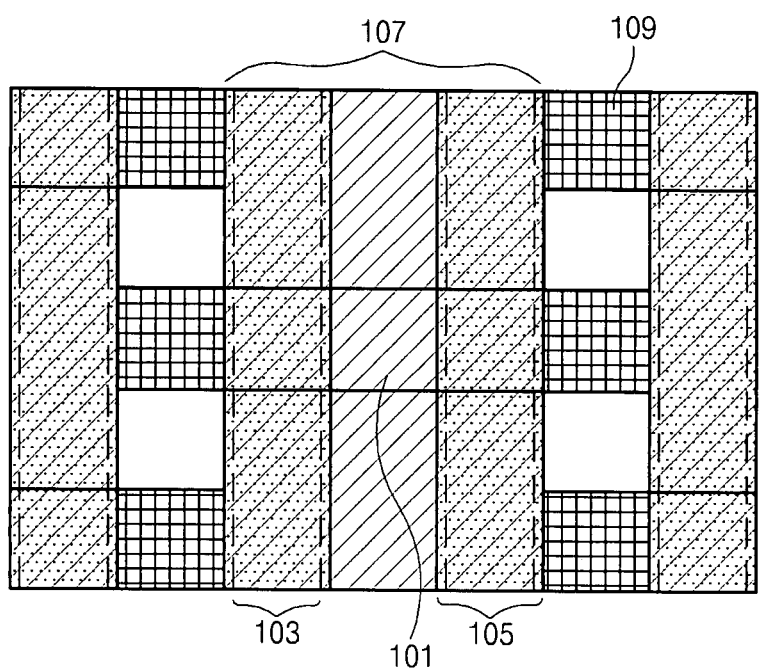
FIG. 1 is a layout of a semiconductor device according to an embodiment of the present invention.

FIG. 1 is a layout of a semiconductor device according to an embodiment of the present invention. The semiconductor device comprises an active region 101, a recess gate region 103, a gate region 105, a recess active region 107 and a recess junction region 109. Active region 101 is defined by a device isolation region. Recess active region 107 includes a bit line region and gate region 105 adjacent to the bit line region, thereby forming active region 101 having a stepped profile. Recess gate region 103 is located in gate region 105 to be narrower than a line-width of gate region 105. Recess junction region 109 is located in active region 101 between recess active region 107 and the device isolation region. For example, recess junction region 109 is disposed in a region where a landing plug for storage node is to be formed.

FIGS. 2a to 2h are cross-sectional views illustrating a method for fabricating a semiconductor device according to an embodiment of the present invention. A device isolation structure 220 is formed in a semiconductor substrate 210 to define an active region 210a. Device isolation structure 220 includes a high density plasma (HDP) oxide film. A photoresist film (not shown) is formed over device isolation structure 220 and active region 210a. The photoresist film is exposed and developed using a mask (not shown) that defines recess active region 107 of FIG. 1 to form a first photoresist pattern 214. A portion of semiconductor substrate 210 is etched using first photoresist pattern 214 as an etching mask to form a first recess 210b. First recess 210b includes the bit line contact region and gate region 105 of FIG. 1.

Figure 2A:
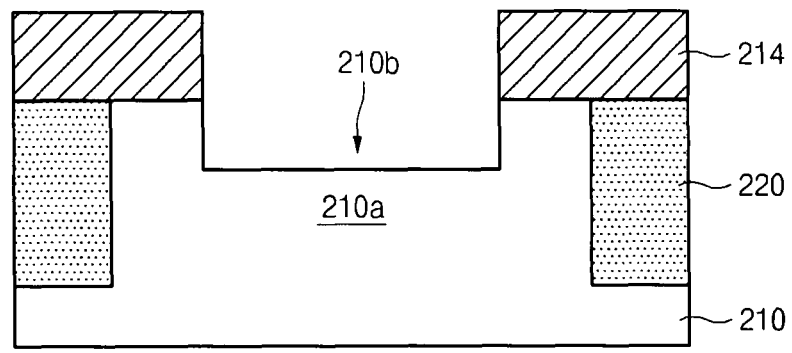
FIGS. 2a to 2h are cross-sectional views illustrating a method for fabricating a semiconductor device according to an embodiment of the present invention.
Figure 2B:
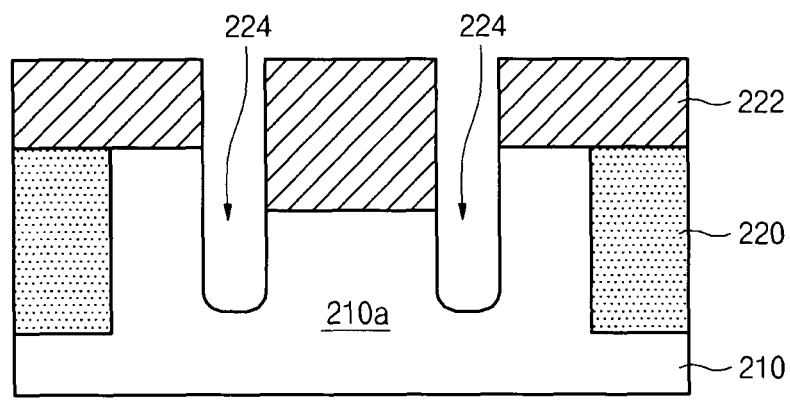
Figure 2C:
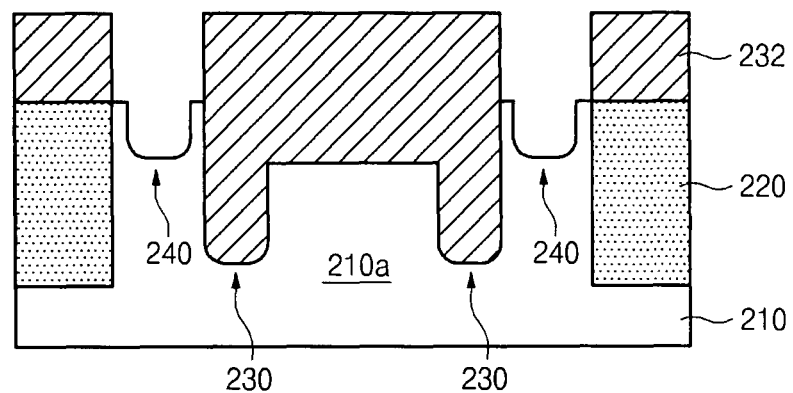

Referring to FIGS. 2b and 2c, first photoresist pattern 214 is removed. A photoresist film (not shown) is coated over device isolation structure 220 and semiconductor substrate 210 including first recess 210b. The photoresist film is exposed and developed using a mask (not shown) that defines recess gate region 103 of FIG. 1, to form a second photoresist pattern 222. A portion of semiconductor substrate 210 is etched using second photoresist pattern 222 as an etching mask to form a second recess 224. Second photoresist pattern 222 is removed to form a gate recess 230. A photoresist film (not shown) is coated over gate recess 230, device isolation structure 220, and semiconductor substrate 210. The photoresist film is exposed and developed using a mask (not shown) that defines recess junction region 109 of FIG. 1 to form a third photoresist pattern 232. A portion of semiconductor substrate 210 is etched using third photoresist pattern 232 as an etching mask to form a third recess 240. Third recess 240 is defined as a recessed junction region. Semiconductor substrate 210 at the bottom of gate recess 230 is further etched to form bulb-type gate recess or a third-dimensional gate recess.

Figure 2D:
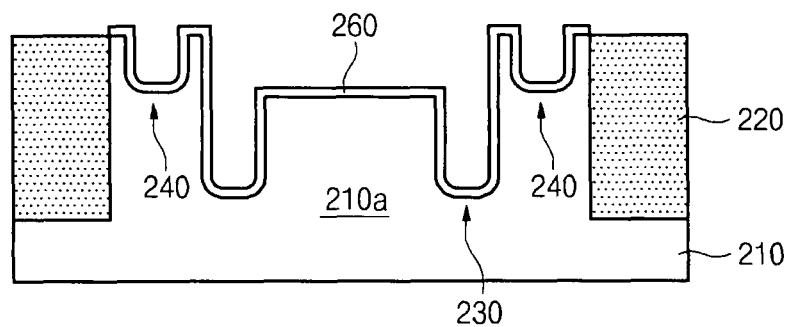
Figure 2E:
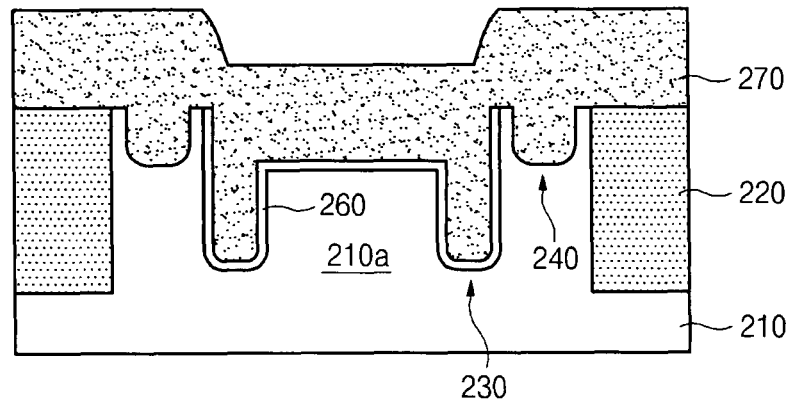

Referring to FIGS. 2d and 2e, third photoresist pattern 232 of FIG. 2c is removed to expose active region 210a including third recess 240 and gate recess 230. A gate insulating film 260 is formed over active region 210a. A photoresist film (not shown) is formed over device isolation structure 220 and gate insulating film 260. The photoresist film is exposed and developed using a mask (not shown) that defines recess contact region 109 of FIG. 1, to form a fourth photoresist pattern (not shown) that exposes gate recess 240. Gate insulating film 260 over third recess 240 is removed using the fourth photoresist pattern as a mask. The fourth photoresist pattern is removed. A lower gate conductive layer 270 is formed over device isolation structure 220, active region 210a, and gate insulating film 260 to fill gate recess 230 and third recess 240.

Figure 2F:
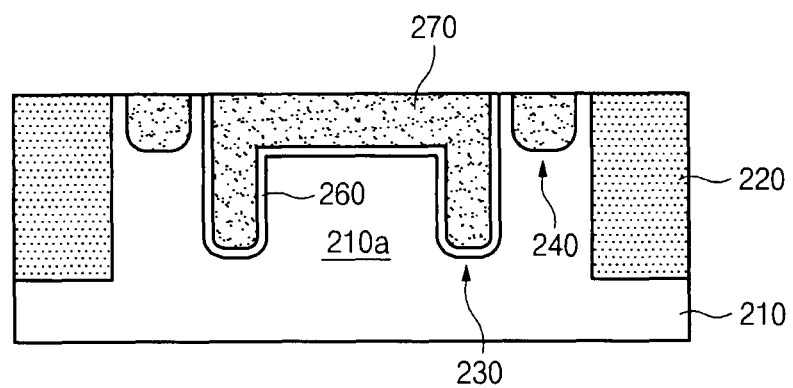
Figure 2G:
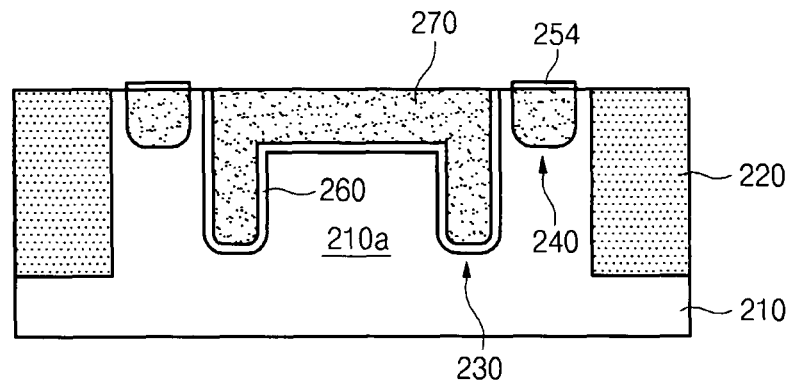

Referring to FIGS. 2f and 2g, lower gate conductive layer 270 is shaped to be planar until semiconductor substrate 210 is exposed. A first insulating film 254 is formed over device isolation structure 220, lower gate conductive layer 270, and semiconductor substrate 210. First insulating film 254 is selectively etched so that first insulating film 254 remains only over third recess 240. The process of shaping the lower gate conductive layer to be planar 270 may be performed by one selected from the group consisting of a chemical mechanical polishing (CMP) method, an etch-back method and a combination thereof. Lower gate conductive layer 270 is shaped to be planar to remove a step difference. Lower gate conductive layer 270 that remains until semiconductor substrate 210 is exposed may be etched by the etch-back method. Lower gate conductive layer 270 may be selected from a polysilicon layer, a SiGe layer and a stacked structure thereof. First insulating film 254 includes a nitride film.

Figure 2H:
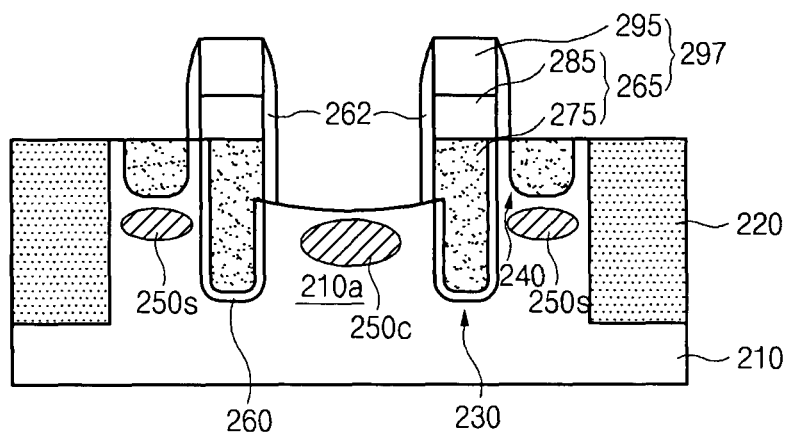

Referring to FIG. 2h, an upper gate conductive layer (not shown) is formed over device isolation structure 220, first insulating film 254, and lower gate conductive layer 270. A gate hard mask layer (not shown) is formed over the upper gate conductive layer. The gate hard mask layer and the upper gate conductive layer are patterned using a mask that defines gate region 105 of FIG. 1, to form a recess gate 297. A second insulating film (not shown) is formed over device isolation structure 220 and recess gate 297. The second insulating film is etched to form a spacer 262 at a sidewall of recess gate 297. Recess gate 297 is formed of a stacked structure including a gate hard mask pattern 295 and a gate electrode 265. Gate electrode 265 is formed of a stacked structure including a lower gate electrode 275 and an upper gate electrode 285. The upper gate conductive layer is selected from the group consisting of a titanium nitride film, a tungsten nitride film, a tungsten silicide layer, a titanium silicide layer, a titanium layer, a tungsten layer and combinations thereof.

Source/drain regions 250c and 250s are formed in semiconductor substrate 210 located at both sides of recess gate 297. Source/drain region 250c formed in a channel region between recess gates 297 is formed by a C-HALO ion-implanting process. For example, after a photoresist pattern (not shown) is formed over recess gate 297 and semiconductor substrate 210 to expose semiconductor substrate 210 between recess gates 297, the C-HALO ion-implanting process is performed to form source/drain region 250c in the channel region of semiconductor substrate 210. An ion-implanting process having high energy may be performed to form source/drain region 250s in semiconductor substrate 210 located in the bottom of third recess 240.

As described above, the present invention may increase a contact area of a landing plug and an underlying semiconductor substrate. Due to the increased contact area, a contact resistance can be reduced between the landing plug and the underlying semiconductor substrate. As a result, the junction leakage current of the semiconductor device can be reduced to improve a data storage capacity and an electric characteristic of the device.

The above embodiments of the present invention are illustrative and not limiting. The invention is not limited by the type of deposition, etching polishing, and patterning steps described herein. Nor is the invention limited to any specific type of semiconductor device.

It will be apparent to those skilled in the art that various modifications and variations may be made in the present invention without departing from the spirit and scope consistent with the invention as defined by the appended claims.

What is claimed is:

1. A semiconductor device comprising:
a semiconductor substrate including device isolation structures to define an active region therebetween, wherein the active region of the semiconductor substrate has a stepped profile, the stepped profile of the active region is arranged to form a recessed channel between gate recesses, and the gate recesses are each formed in the semiconductor substrate for forming a respective recess gate thereon;
recessed junction regions that are each formed in the semiconductor substrate between a respective one of the gate recesses and a respective one of the device isolation structures and arranged to electrically contact the recessed channel; and
a first source-drain region which is located under each of the recessed junction regions, wherein the highest point of the first source-drain region is lower than those of the device isolation structures and the highest point of the active region between the gate recesses is lower than the highest points of the active region in areas between each of the gate recesses and the respective one of the device isolation structures.

2. The semiconductor device of claim 1, wherein the stepped profile of the active region forms a recessed active region.

3. The semiconductor device of claim 1, wherein the recessed junction regions are formed between the stepped profile of the active region and the device isolation structures adjacent to the stepped profile of the active region.

4. The semiconductor device of claim 2, wherein the semiconductor substrate includes a second source-drain region located in the recessed active region.

5. The semiconductor device of claim 1, wherein the semiconductor substrate includes the first source-drain region which is located under the recessed junction regions and is separate from the recessed junction regions in the semiconductor substrate, wherein recesses of the recessed junction regions each form a sidewall of a respective one of the recessed junction regions.

6. The semiconductor device of claim 1, wherein the semiconductor substrate includes a recess forming a boundary in each of the recessed junction regions and the highest point of the active region between the gate recesses is lower than the highest point of the boundary of each of the recesses formed in the recessed junction regions.

* * * * *